United States Patent

Agarwala et al.

[11] Patent Number: 5,130,779
[45] Date of Patent: Jul. 14, 1992

[54] SOLDER MASS HAVING CONDUCTIVE ENCAPSULATING ARRANGEMENT

[75] Inventors: Birendra N. Agarwala; Aziz M. Ahsan, both of Hopewell Junction; Arthur Bross, Poughkeepsie, all of N.Y.; Mark F. Chadurjian, Essex Junction, Vt.; Nicholas G. Koopman, Hopewell Junction, N.Y.; Li-Chung Lee, Saratoga, Calif.; Karl J. Puttlitz; Sudipta K. Ray, both of Wappingers Falls, N.Y.; James G. Ryan, Essex Junction, Vt.; Joseph G. Schaefer, Berkshire, N.Y.; Kamalesh K. Srivastava, Wappingers Falls, N.Y.; Paul A. Totta, Poughkeepsie, N.Y.; Erick G. Walton, South Burlington; Adolf E. Wirsing, South Hero, both of Vt.

[73] Assignee: International Business Machines Corporation, Armonk, N.Y.

[21] Appl. No.: 540,256

[22] Filed: Jun. 19, 1990

[51] Int. Cl.⁵ ............... H01L 23/48; H01L 23/50; H01L 23/54
[52] U.S. Cl. .......................... 357/67; 357/68; 357/71
[58] Field of Search ............ 357/71, 67, 68; 174/261; 228/179, 180.1, 180.2, 178

[56] References Cited

U.S. PATENT DOCUMENTS

| | | | |
|---|---|---|---|
| 3,496,428 | 2/1970 | Volder | 357/71 |
| 3,512,051 | 5/1970 | Noll | 357/71 |
| 3,761,309 | 9/1973 | Schmitter et al. | 357/71 |
| 3,809,625 | 5/1974 | Brown et al. | 204/15 |
| 3,821,785 | 6/1974 | Rose | 357/67 |
| 3,986,255 | 10/1976 | Mandal | 357/71 |
| 4,545,610 | 2/1970 | Miller et al. | 317/101 |
| 4,626,479 | 12/1986 | Hosoi et al. | 357/71 |
| 4,664,309 | 5/1987 | Allen | 228/180.2 |
| 4,673,772 | 6/1987 | Satoh et al. | 174/52 |
| 4,739,917 | 4/1988 | Baker | 228/123 |
| 4,783,722 | 11/1988 | Osaki et al. | 174/261 |

FOREIGN PATENT DOCUMENTS

| | | |
|---|---|---|
| 0229426 | 12/1986 | European Pat. Off. . |
| 0229850 | 7/1987 | European Pat. Off. . |
| 0248314 | 12/1987 | European Pat. Off. . |
| 0248566 | 12/1987 | European Pat. Off. . |

OTHER PUBLICATIONS

Herdzik, et al, IBM Technical Disclosure Bulletin, vol. 21, No. 12, p. 4834 (May 1979).
N. Matsui, et al., "VLSI Chip Interconnection Technology Using Stacked Solder Bumps," IEEE Proceedings of 37th Electronic Components Conference, pp. 573-578, May 11-13, 1987.
"Small, Thick Solder Pad Formation" IBM Technical Disclosure Bulletin, vol. 27, No. 12, May 1985.

*Primary Examiner*—Rolf Hille
*Assistant Examiner*—S. V. Clark
*Attorney, Agent, or Firm*—Ira David Blecker

[57] ABSTRACT

The present invention relates generally to a new interconnection and a method for making the same, and more particularly, to an elongated solder interconnection and a method for making the same. On an electronic carrier, a pad is formed on which a solder mass is deposited and capped with a metal layer, thereby forming an elongated solder interconnection. A further elongated solder interconnection can now be formed by forming a second solder mass on the first solder mass that has been capped by a metal layer. Additional elongated solder interconnection can be formed by capping the preceding solder mass and/or the last solder mass with a metal capping layer. Alternatively, the encapsulating layer can be in the form of a sidewall spacer formed on the sidewalls of the solder mass.

47 Claims, 4 Drawing Sheets

SOLDER MASS HAVING CONDUCTIVE ENCAPSULATING ARRANGEMENT

FIELD OF THE INVENTION

The present invention relates generally to a new interconnection and a method for making the same, and more particularly, to a solder interconnection and a method for making the same. On a semiconductor component a pad is formed on which a solder mass is deposited and capped with a metal layer, thereby forming a solder interconnection which is elongated. Alternatively, sidewall spacers could be formed about the sides of the solder mass to form the elongated solder interconnection. A further elongated solder interconnection can now be formed by forming a second solder mass on the first solder mass that has been partially or fully encapsulated by the metal layer. Additional elongated solder interconnections can be formed by capping the preceding solder mass and/or the last solder mass with a metal encapsulating layer, thereby forming the solder interconnection which is elongated.

BACKGROUND OF THE INVENTION

In the electronics industry different semiconductor components have to be joined to each other. For each component a different method or process may be employed. The surface mounting method is sometimes used to connect one semiconductor component to another. Usually, one or both of the semiconductor components are provided with C4 (Controlled Collapse Chip Connection) pads, and then using reflow solder these semiconductor components are joined together. The semiconductor components or elements may be a chip or a substrate, such as for example, a multi-layer ceramic substrate.

A chip may be connected to a substrate using the effect of wetting and diffusion of a completely melted solder. Since it is necessary to melt the solder completely, segregation of the alloy occurs. This segregation often results in defects and residual stress that show up during the cooling stage of the solder.

The reflowed solder normally has a cast structure with low height and large circumferential area, i.e., low aspect ratio. The solder having a cast structure and low height sometimes has serious problems, such as, producing non-uniform strain, or solder being fractured by various kinds of stresses produced during accelerated life test. These fractures usually occur in a comparatively short period of time due to a variety of reasons, one of them being the metal fatigue of the solder.

Such a problem of solder interconnection has become more important with the increasing tendency towards miniaturization of electronic components or parts and an increase in mounting densities as in the case of LSI (Large Scale Integration) circuits.

The normal shape of a C4 connection is a truncated sphere with an aspect ratio, i.e., height to width ratio, of approximately 0.5. The flattened or barrel shape is not optimum from the standpoint of mechanical properties. Under induced stress, strain in the solder connection tends to be non-uniform and is concentrated in the reduced cross-sectional area near the terminations of the joint. And, since the strain is inversely proportional to the height, the strain is high due to the low aspect ratio. The shape of the solder mass is controlled by the solder surface tension forces acting on the molten ball of solder and the surface of the mounting component. Ways to overcome the surface tension forces of the molten solder have been explored, so as to increase the height (i.e., the aspect ratio) and reduce the strain concentration in the reduced sections near the termination. Such techniques have been shown to dramatically improve the fatigue life of solder joints since the fatigue life is inversely proportional to the square of the strain, i.e., one-half the strain gives four (4) times the fatigue life.

Another problem is the thermal expansion mismatch between a chip, such as a silicon chip, and a module or a substrate, such as an alumina substrate. Thermal expansion mismatch between the chip and the module produces mechanical stress in the joints because of the difference in coefficients of thermal expansion between the silicon of the circuit chip and the ceramic used for the module substrate. This thermal mismatch also generates shear strain on the C4 joint and thus reduces the life of the C4 joint. This problem has been partially solved by the use of ceramic substrates which match the thermal expansivity of the silicon chip, but still the dynamic shear strain or the thermal fatigue generated during switching on/off powering of the silicon circuitry cannot be eliminated and this results in fatigue failure of the C4 joint.

The above thermal fatigue problem, which differs from the mechanical fatigue in that fixed strain levels rather than fixed stress levels are exhibited, has long prevented the semiconductor industry from fabricating larger chips, or making high density C4 arrays with larger distance to neutral point. In short, the C4 fatigue problem has constrained the semiconductor industry from advancing to ultra-large-scale integration (ULSI).

Another method of extending the reliability of the C4 solder interconnect between a chip, such as a silicon chip and a substrate, such as an alumina substrate is to increase the chip "height", i.e., the distance from the chip mounting surface to the substrate.

In order to provide elongated solder connections between a semiconductor device and a supporting substrate, Lakritz et al. in U.S. Pat. No. 4,545,610, disclosed the use of solder extenders. On a supporting substrate a solder extender is formed, and a semiconductor device having solder mounds is invertedly placed over the substrate, such that solder extenders and the solder mounds have a direct surface to surface contact. This whole assembly is then heated to a temperature sufficient to melt the material of the solder extender and the solder mound, thus forming elongated hour-glass shaped solder connections between the device and the substrate.

Allen et al. in U.S. Pat. No. 4,664,309, taught that the life of a solder joint can be increased substantially by a relatively small increase in solder joint height, or that a reduction in solder joint diameter would also extend the life of a solder joint, and to this end they invented a mounting device to securely hold preforms of a joint-forming material in an aperture, such as a solder column.

Satoh et al. in U.S. Pat. No. 4,673,772, found another method of alleviating the kind of stresses produced due to the metal fatigue of the solder by having a low-melting point solder at the ends of a high-melting point solder that connects an assembly to a substrate, thereby getting high solder columns.

Recently, another technique has been presented to form stacked solder bumps. Solder bumps are stacked one on top of each other while a polyimide or ceramic film or sheet is used to support the solder bumps. See for example, European Patent Application Publication No. 229,850, or Matsui, N. et al., "VLSI Chip Interconnection Technology Using Stacked Solder Bumps", pp. 573-578, 1987 Proceedings of the 37th Electronic Components Conference, May 1987.

European Patent Application Publication No. 248,314, discloses the use of a mask, such as a photoresist, to act as a mold for the solder, and thereby producing large solder bump heights. Another method of producing large solder bump heights has been disclosed in European Patent Application Publication No. 248,566, where solder bumps on a bumped package and on the bumped substrate are heated and the contacting solder bumps melt together and coalesce to form an "elongated" solder joint.

There have been other proposals that have dealt with forming elongated solder bumps. One of the approaches was to stretch the solder by pulling chips from the substrate or module during solder reflow operation, thereby forming an "elongated" solder bump.

The elongated solder mass that is formed by the various aspects of this invention is simple and unique. The basic concept is to control the collapsing of the solder mass or bump by protecting it with an encapsulating material or layer. Additional solder mass or bumps that are formed over the first substantially encapsulated solder mass can also be protected by additional material or layer.

This invention also contemplates the formation of a barrier material or layer, that would reduce or eliminate intersolder diffusion. This barrier material or layer could be formed over the encapsulating material or layer, or the encapsulating material or layer itself could be the barrier layer or material.

The site that is used for the formation of the single or multilevel solder interconnection of this invention is normally an electronic component, such as a substrate or a chip. But the site for single or multi-level solder mass of this invention could be a ball limiting metallurgy layer or any electrical conductor.

SUMMARY OF THE INVENTION

One aspect of this invention discloses a solder interconnection comprising, a site for a solder mass, a solder mass on the site, and a material substantially encapsulating the solder mass.

Another aspect of this invention discloses a solder interconnection comprising, a site for a first solder mass, a first solder mass on the site, a first electrically conductive material substantially encapsulates the first solder mass, and at least a second solder mass on the first electrically conductive material.

Another solder interconnection is also disclosed, wherein a second electrically conductive material substantially encapsulates the second solder mass, and at least a third solder mass is formed on the second electrically conductive material.

A process for forming a solder interconnection is also disclosed comprising, locating a site for a solder mass, forming a solder mass, and substantially encapsulating the solder mass with an electrically conducting or an insulating material.

Another process for forming a solder interconnection is also disclosed comprising, locating a site for a first solder mass, forming a first solder mass, substantially encapsulating the first solder mass with a first electrically conductive material, and forming a second solder mass on the first electrically conductive material.

Still another process is also disclosed for forming a solder interconnection, wherein a second electrically conductive material is formed on the second solder mass, and at least a third solder mass is formed on the second electrically conductive material.

The solder interconnection made from any aspect of this invention can also be formed on a decal, and then later transferred onto an active or a passive electronic component, such as a chip or a substrate.

Additionally, the solder interconnection made from any aspect of this invention can have a barrier material that is formed over the electrically conductive encapsulating material, and in some cases the electrically conductive encapsulating material itself could act as the barrier material.

In another embodiment of the invention, an elongated solder mass may be formed by using an encapsulating material which is put only on the side of the solder mass and from herein on will be called a sidewall spacer. The sidewall spacer constrains the solder column during reflow.

If desired, the solder column made from any aspect of this invention may be further elongated by the addition of one or more solder masses on the first solder mass. These additional solder masses may be made either with or without sidewall spacers.

The word "encapsulating" as used herein means not only to encase as if in a capsule but also to surround the solder mass. The encasing could be from top of the solder mass all the way to the site or substrate or it could be partial encasing. Similarly, the solder mass could be surrounded with a material without having a capping type of a layer. In all cases, it is contemplated that at least a portion of the side wall of at least the first solder mass is covered with a layer of some material.

The structure that is formed using any of the process of this invention is then later joined with another active or passive electronic component. This joining process is well known to the people skilled in the art.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Figure 1:
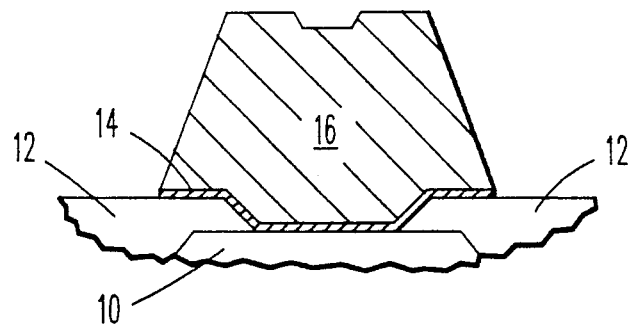
FIG. 1 is a side view of a conventional, non-elongated solder mass showing the solder mass as deposited.

The elongated solder masses that are formed by this invention are simple and unique. The basic concept is to control the collapsing of the solder mass or bump by protecting it with a metal encapsulating material/layer or by surrounding it with a "dam" formed by sidewall spacers of either electrically conductive or insulating materials. Additional solder mass or bumps that may be formed over the first elongated solder mass may also be encapsulated by additional electrically conductive material or supported by sidewall spacers which are made of either electrically conductive or insulating materials.

Furthermore, a barrier material or layer could also be provided with the solder interconnection that would reduce or eliminate intersolder diffusion. This barrier material or layer could be formed over the electrically conductive encapsulating material or layer, or the encapsulating material or layer itself could be the barrier layer or material.

The site that is used for the single or multilevel solder interconnection of this invention is normally an electronic component, such as a substrate or a chip. But the site for the single or multilevel solder mass of this invention could be a ball limiting metallurgy layer or an electrical conductor.

The C4 fatigue life simulation studies that have been done so far have indicated that by doubling the joint height, the fatigue life can be improved by at least a factor of 3. Therefore, efforts are being made to increase the solder height.

Extending the reliability (or fatigue life) of a solder ball interconnect can also be realized by increasing the distance between a chip and a substrate, i.e., by maximizing the aspect ratio, i.e, height to diameter ratio of the connecting solder ball structure. Therefore, it is contemplated that the aspect ratio of the solder interconnection made according to any aspect of this invention is equal to or greater than 0.50.

If a high-melt or a high melting point solder material in conjunction with a low-melt or a low melting point solder material is used then there is an additional benefit of enhanced fatigue life due to an increase in the C-4 joint height. The height increase results from the fact that the high-melting point solder remains in its as-evaporated shape, i.e., does not melt either during wafer fabrication or during the chip-joining cycle.

The metal encapsulating layer that is formed over the solder mass should be compatible with the solder component to form a strong bond thereto, while maintaining its shape by overcoming surface tension forces of molten solder, i.e., the electrically conductive material must act to confine the solder "liquid" so it does not "ball up." Various methods of deposition could conceivably be used, such as, sputtering, plating, evaporation, etc. The metal encapsulating layer could also be deposited from low radiation RF or resistive evaporation sources.

Normally, a wettable rigid metal layer is used as the electrically conductive encapsulating layer. The rigid metal encapsulating layer or electrically conductive material is selected from metals, such as Co, Cu, Ni, Pd, Pt, Ru and their alloys.

Electrically conductive barrier materials that can be used with the solder interconnection of this invention and that is not wettable to solder include materials such as Be, Cr, Fe, Hf, Mo, Nb, Ta, Ti, V, W, Zr and alloys thereof.

A sandwich comprising of a wettable layer with embedded barrier metal may also be used, as the encapsulating layer for the solder mass, for example, Cu/Cr/Cu or Cu/Hf/Cu or Cu/Mo/Cu or Cu/Ti/Cu or Cu/W/Cu or Cu/Zr/Cu. Alternatively, a sandwich structure could be formed by one or more of the wettable rigid metal layers described above, encapsulating one or more of the nonwettable barrier materials described above. This sandwich can also be used for all subsequent layer formation.

The material that is selected for the metal capping or encapsulating layer should preferably allow subsequent solder mass formation to adhere to its top surface and not to its sides. One way to solve this problem is to form or apply a barrier layer on top of the metal capping layer that is selectively wettable to solder so that solder mass or bump is only formed on the upper surface of the metal capping layer and not on the sides.

Because they are capped with a rigid metal capping layer, the elongated solder bumps that are formed using the process of this invention also do not exhibit a slumping problem. The tall solder columns of this invention will have a higher structural integrity than the columns that do not have a coating or covering of a rigid metal capping layer.

The melting point of a subsequent solder mass can be the same as that of the first solder mass, but, if different melting point solders are used for subsequent solder mass formation then the solders should not be allowed to interdiffuse, because the melting point of the low-melt or low melting point solder will increase such that a subsequent low-temperature removal of the chip or the substrate would be very difficult if not unachievable.

This problem of interdiffusion of the solder can also be solved by the formation of a barrier layer which would be located between the two solder layers. Its purpose is to prevent interdiffusion between the low and high melting point solder layers it separates, and it is a major factor in assuring the joint's reworkability and utility.

One way of forming such barrier layers is the embedded sandwich structure discussed above. Alternatively, a wettable barrier sandwich material that is formed as part of the solder interconnection of this invention could be used, such material being selected from a group comprising cobalt, copper, nickel, palladium, platinum, ruthenium and their alloys.

The barrier material could be formed over the ball limiting metallurgy or over any of the other electrically conductive encapsulating materials. Alternatively, the ball limiting metallurgy or any of the other electrically conductive encapsulating materials that are formed over the solder mass could act as the barrier material.

Normally, the high melting point solder, adjacent to the chip or substrate, constitutes the bulk (approximately 80 percent) of the solder joint. It provides the joint with the required creep, thermomigration and electromigration resistance. These are some of the desirable properties which current C4 joints possess. The low melting point solder layer allows the chip to be attached to the next level of packaging at substantially lower temperatures (approximately 100° C. less) than would the high melting point solder. This aspect makes it possible to take advantage of organic dielectric or insulator materials that have low dielectric constants. Typically, such materials have insufficient thermal stability to be compatible with today's high temperature processing. Also, for the low-end packages utilizing direct-chip attachment to an organic board, such as a carbon-based board, a lowering of the chip-joining temperature is essential to maintain the board's integrity.

Chips with 97 percent Pb and 3 percent Sn C4 balls are normally joined to the substrate by melting the solder in the temperature range of 340° C.-365° C. For both high-end and low-end packaging, the desire is to lower the chip-join temperature range to approximately 250° C.-300° C. This reduction is motivated by, among others, the desire to take advantage of the low-dielectric constant materials discussed above.

One prior art approach in order to achieve low temperature chip joining is to lower the melting point (liquidus temperature) of the C-4 solder by increasing its solute content (e.g., with Sn or In) to the 40-60 weight percent range. Tests have shown a marked increase in bulk diffusivity with an increase in either Sn or In content. As a result, the Pb/Sn C4 joint becomes susceptible to failure due to creep deformation ("pad squashing") and thermomigration-related void formation. Thus, low-temperature chip joining achieved with Pb-high-Sn or Pb-high-In solders at present is not a viable approach using conventional C4 structure to improve C4 reliability performance.

For the elongated solder mass structure disclosed herein, the electromigration and thermomigration susceptibility at the BLM (Ball Limiting Metallurgy) solder interface remains unchanged as compared to the solder masses currently in use. The susceptibility to electromigration or thermomigration failure at the low-melt solder—barrier interface is believed to be minimal because of current spreading and diffused thermal gradient at this interface.

Also, when the low-melt solder reflows to its mating substrate pad, the high-melt solder remains in the solid state, as it does during the prior reflow cycle. This results in an increase in C4 height, which in turn results in an increased fatigue life.

Another possible approach in order to control the electromigration or thermomigration would be to apply or form a barrier material or layer over the site for the solder mass. A similar barrier material or layer could also be applied over the site of any subsequent solder masses. As discussed elsewhere the barrier material could also act as the encapsulating material.

The formation of a rigid layered structure constrains the lead-based solder reflow properties such that the amount of collapse which normally occurs, both during initial pad reflow and subsequent chip/substrate joining process, is significantly reduced. The result is an increase in chip mounting height due to a significant increase in the pad aspect ratio. An additional reliability enhancement is realized because the layer formed on top of the solder column distributes and lowers the strain of the solder ball connection.

The use of multiple rigid layers or sidewall spacers in the C4 pad would improve mechanical integrity and the reliability of the C4 joint. The solder interconnection could have at least one electrically conductive rigid layer or a rigid sidewall spacer made of either a conductor or an insulator or a layered structure. These rigid structures could be a part of or formed over the pad, or they could be part of or formed over any one or more of the electrically conductive encapsulating materials. This would also help to maximize the C4 aspect ratio.

Using multiple rigid layers in the C4 pad, one would be able to join different electronic components (such as Si, GaAs, or other Group III and V or Group II and VI compounds), and parts to the same substrate and there will no longer be a need to worry about the thermal mismatch of the materials.

These elongated solder bumps would be most useful for larger chips that have a high input/output count, because a thin solder bump could be made structurally stronger by providing it with a rigid metal capping or encapsulating layer.

With the use of these encapsulated solder masses, the creep-related failure concerns are also eliminated since creep is confined to the very thin layer of low-melt solder. Pad to pad shorts failures are thus also avoided.

The use of the high aspect ratio C4s has many advantages, such as, reduce shorting risk between pad structures or other pads, provide more room for under chip structure (such as, Engineering Change "wires," pads, etc., and allow for multiple solder to be utilized for reliability enhancements (creep, electromigration) and low-temperature processing, to name a few.

Some of the other advantages of a high aspect ratio C4 include, a reduced risk of electrical shorts between pad structures and the potential benefit of reduced minimum pad spacing. The option of choosing a low melting point solder tailored for a specific use is expected to provide a significant set of reliability enhancements due to improved creep and electromigration resistance as well as the benefit of low-temperature processing.

This invention will also allow the semiconductor industry to scale up the chip size and to integrate much more circuitry into a single chip.

Similarly, the semiconductor industry will be able to utilize the high performance substrates with low dielectric constant and high thermal conductivity. Matching of the thermal expansivity of chip and substrate materials will no longer be a constraint in the material selection.

FIG. 1, is a side view of a reflowed conventional solder mass or bump. A passivation layer or a substrate 12, has a terminal via or a conductor 10. The conductor 10, may be completely inside the substrate 12, or a portion of the conductor may be exposed. If the conductor 10, is completely inside the substrate 12, then by methods well known in the art a portion of the conductor 10, must be exposed, as shown in FIG. 1. On this exposed portion of the conductor 10, a BLM or Ball Limiting Metallurgy layer 14, is formed. The conductor 10, or the BLM layer 14, could be the site for the formation of the solder mass 16. The BLM layer 14, could also be a barrier layer as discussed earlier. The BLM layer 14, is usually a layered structure of Cr/Cu/Au or Ti/Cu/Au, but other types of materials could also be used. The BLM layer controls the solder bump 16, that will be subsequently formed, such as by evaporation. The solder bump 16, is evaporated or deposited on top of the BLM layer 14, by methods well known in the art. The solder interconnection that is formed, is formed normally on an active or a passive electronic component, such as a chip or a substrate.

Figure 2:
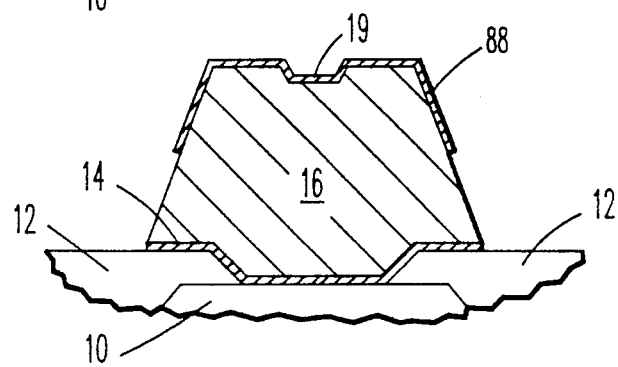
FIG. 2 is a side view of an elongated solder mass showing the metal capping layer over the first solder mass, both as deposited.

As shown in FIG. 2, a partial metal encapsulating or capping layer or electrically conductive material 88, is applied over the solder mass or bump 16, to substantially encapsulate the solder mass 16. The electrically conductive material 88, is a suitable rigid metal capping layer, e.g., nickel, but other materials as discussed elsewhere can also be used.

Figure 3:
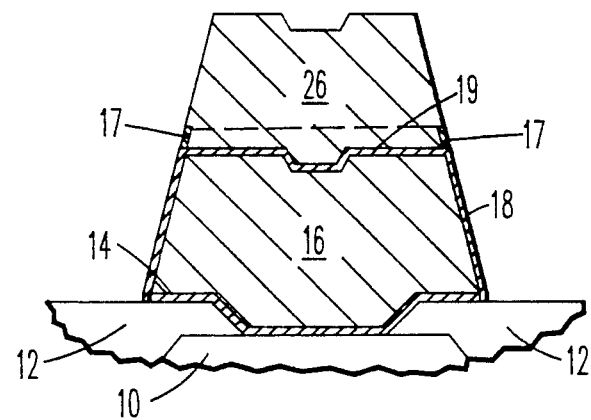
FIG. 3 is a side view of an elongated solder mass with a second solder mass deposited upon the structure of FIG. 2.

One method of forming the electrically conductive encapsulating layer 18 or 88, is to mask the upper surface of the substrate 12, leaving only the surface of the solder bump 16, exposed. A suitable metal would then be evaporated and allowed to be deposited onto the mask (not shown) as well as on to the exposed surface of the solder bump 16, thereby forming the metal capping or electrically conductive encapsulating layer 18 or 88. The encapsulating layer 88, as shown in FIG. 2, encapsulates the first solder mass 16, but the encapsulating layer 88, could be similar to the encapsulating layer 18, as shown in FIG. 3, and still allow the formation of subsequent solder masses. The mask, whether it is metallic or non-metallic or a dry resist or a photoresist or a mask made from some composite material, basically is used to define the openings for the solder interconnection. This defining of the openings could include, the formation of the solder mass or the electrically conductive encapsulating material.

Other techniques for deposition of the metal encapsulating layer could also be used, such as, sputtering, CVD deposition, electroplating techniques, to name a few.

Even higher aspect ratios can be obtained by using multiple masks such as the combination of metal mask and dry film mask. One such method of forming the metal encapsulating layer 18 or 88, would be to place a metal mask on top of a pre-patterned dry film (e.g. Riston) (Riston is a Trademark of E. I. du Pont De Nemours & Co., Wilmington, Del.). Metal is then deposited over this dry film and the metal mask is then removed. This is followed by the dissolution of the dry film. The metal left on the substrate are the solder mass or studs. The Riston process allows the use of a 6 mil thick Riston lift-off stencil and higher aspect ratio columns therefore can be fabricated.

FIG. 3, shows a second solder mass or bump 26, being formed on the upper surface 19, of the fully encapsulated electrically conductive metal layer 18. The material used to make the layer 18, is in the same used to make the partial encapsulating layer 88. In forming the second solder bump 26, the second solder bump or mass 26, can have a different melting point than the first solder bump 16, or they both can have the same melting point. If the first solder bump 16, has a higher melting point than the second solder bump 26, then during the formation of the second solder bump 26, the first solder bump 16, will not melt and elaborate procedures will not have to be undertaken to prevent the first solder bump 16, from collapsing. If the melting point of the second solder mass 26, is the same or lower than the already encapsulated first solder mass 16, then care will have to be taken to insure that the first solder mass 16, does not collapse during reflow by proper placement and control of the encapsulating layer 18.

If, both solder masses, i.e., solder 16 and 26, have the same composition and/or melting point, then the confining metallurgy or the electrically conductive material 18, substantially encapsulating the solder mass is most effective and will prevent the shape of the solder from changing during reflow and joining. This would also be true for any subsequent solder masses that are formed over the confining metallurgy or the electrically conductive material 18.

In an alternative structure solder mass 26, can be of a different composition and/or melting point, such as having a lower melting point than solder mass 16, and, in that case the electrically conductive material or the "confining" metallurgy 18, then becomes most effective as a barrier layer preventing solder mass 16 and solder mass 26 from mixing and/or reacting with each other.

The solder interconnection of this invention normally has the base cross-sectional area for the first solder mass larger than the base cross-sectional area for the second solder mass, but, it could be the same. That is, as shown for example in FIG. 1, the solder mass base, that part that is in contact with BLM layer 14, is larger and has a greater cross-sectional area than the top of the solder mass. Then, the subsequent solder mass would have a base that generally corresponds in cross-sectional area with the top of the first solder mass. This is shown, for example, in FIG. 3. It is preferred that for any subsequent solder masses that are formed, the base cross-sectional area should be smaller than the base cross-sectional area for the previous solder mass.

Furthermore, in order to prevent the second solder mass 26, that is formed over the first solder mass 16, or the metal encapsulating layer 18, or the barrier layer 39, one can deposit a material that is not wettable to solder 26, to prevent the solder 26, from running down from the upper surface or side of the solder mass 16. On the other hand a peripheral ring 17, or a basket or a dam (not shown) could be formed out of non-solder wettable material on top of the solder mass 16, or metal encapsulating layer 18, or the barrier layer 39, to prevent the second solder mass 26, from running down the sides of the already deposited first solder mass 16. The peripheral ring to prevent the running down of a subsequently deposited solder mass can be formed at any level.

Figure 4:
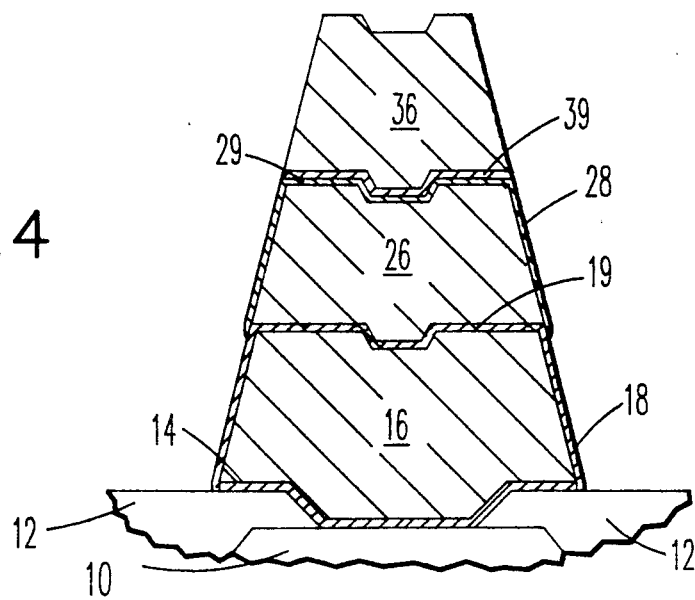
FIG. 4 is a side view of another embodiment of an elongated solder mass made according to the present invention.

FIG. 4 illustrates another embodiment of the elongated solder mass made according to this invention. On the top of the terminal or conductor 10, using conventional BLM's (Ball Limiting Metallurgy) 14, and first solder mass or bump 16, is evaporated. Then, thin layers of confining metallurgies or electrically conductive material 18, are conformably coated by, e.g., either sputter deposition or evaporation with an off-centered source. Another layer of thick solder or second solder bump or mass 26, is deposited on top surface 19, of the electrically conductive material 18. A second thin layer of confining metallurgies or electrically conductive material 28, substantially encapsulating the solder mass 26, is then conformably formed over the second solder bump or mass 26, by, e.g., either sputter deposition or evaporation with an off-centered source. Subsequently, a third solder bump or thick solder 36, is formed over the upper surface 29, of the second metal capping layer or electrically conductive material 28. This process of forming additional solder bumps and then encapsulating or capping them with a thin layer of electrically conductive material or confining metallurgies can be carried on until the solder mass or bump has the desired height, i.e., final aspect ratio. One of the only requirements for the confining metallurgies or the metal capping layers is that they be metallurgically compatible with the solder that they come in contact with and that the metal capping film or layer must be more rigid than lead.

Figure 5:
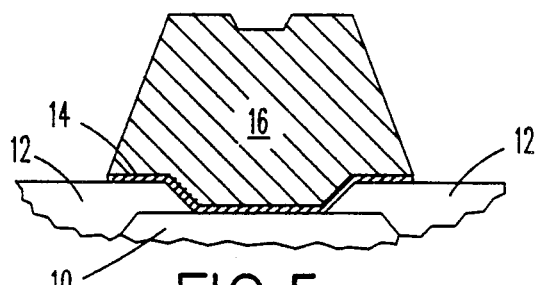
FIG. 5 (Prior Art) is a side view of a conventional, non-elongated solder mass showing the solder mass prior to reflow.

FIG. 5 is a side view of a conventional, non-elongated solder mass showing the solder mass 16, prior to reflow. This solder mass 16, is the same as the one shown for FIG. 1. The solder mass 16, as shown follows the contour of the substrate 12.

Figure 6:
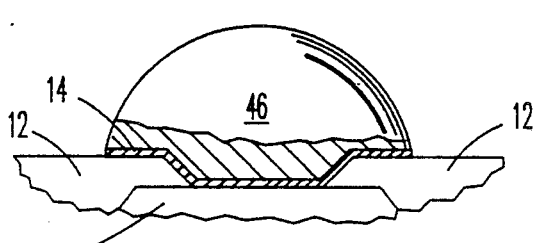
FIG. 6 (Prior Art) is a side view of a conventional, non-elongated solder mass showing the solder mass after reflow.

FIG. 6 is a side view of a conventional, non-elongated solder mass showing the solder mass 16, of FIG. 5, after reflow and forming the solder mass 46, having a shape as shown.

Figure 7:
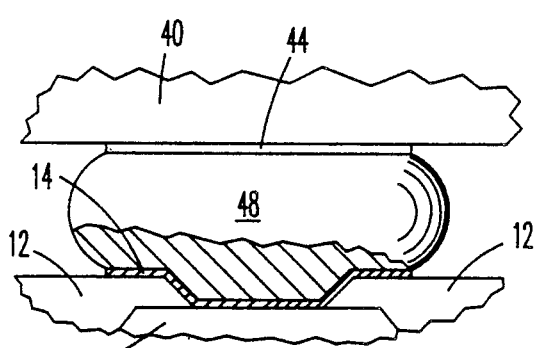
FIG. 7 (Prior Art) is a side view of a conventional, non-elongated interconnection showing the solder mass of FIG. 6, after joining to a substrate.

The solder mass 46, after it is joined to a pad 44, of a substrate 40, takes on the shape of a solder mass 48, which looks more like a truncated sphere, as shown in FIG. 7. Normally, pads 44, are used to attach the solder mass 48, to the substrate 40. As can be clearly seen in FIG. 7, that the diameter of the solder mass 48, has increased and the height of the solder mass 48, has decreased, compared to it's original shape as shown in FIG. 5, as solder mass 16, or as solder mass 46, as shown in FIG. 6.

Figure 8:
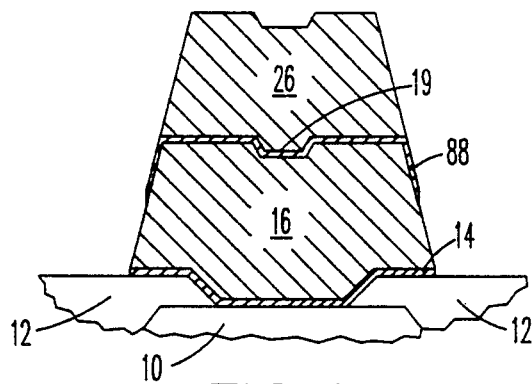
FIG. 8 is a side view of another embodiment of an elongated solder mass made according to the present invention, showing the second solder mass prior to reflow.

FIG. 8 is a side view of an embodiment of an elongated solder mass made according to the present invention, showing the second solder mass 26, without an encapsulating layer prior to reflow. The formation of the first solder mass 16, and the encapsulating layer 88, are formed in the same manner is discussed earlier in reference to FIGS. 2 and 3. The encapsulating layer 88, as shown in FIG. 8, partially encapsulates the first solder mass 16, but this partial encapsulation still allows for the formation of subsequent solder mass and also prevents the first solder mass 16, from deforming.

Figure 9:
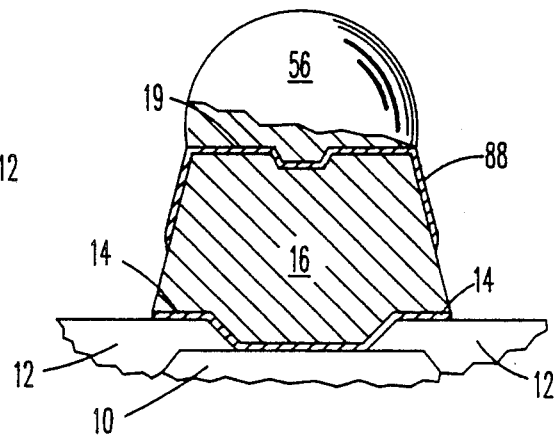
FIG. 9 is a side view of the elongated solder mass made according to the present invention, showing the second solder mass after reflow.

FIG. 9 is a side view of the elongated solder mass showing the second solder mass 26, after reflow forming the solder mass 56. As can be seen in the figure the solder mass 56, which does not have an encapsulating layer has taken the shape as shown.

Figure 10:
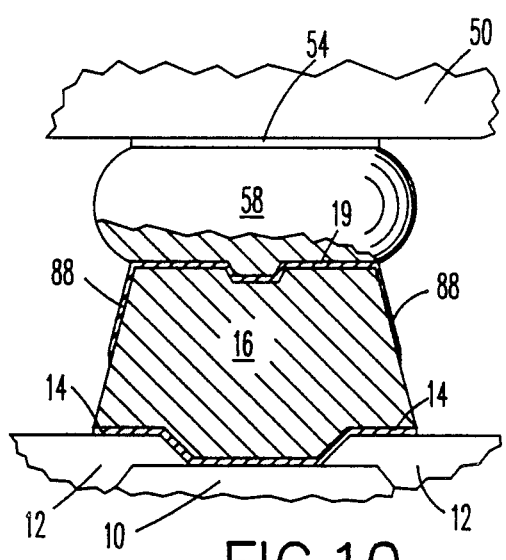
FIG. 10 is a side view of the elongated interconnection showing the solder mass of FIG. 9, after joining to a substrate.

FIG. 10 is a side view of the elongated interconnection showing the solder mass 56, of FIG. 9, after it has been attached to the pad 54, of a substrate 50. As discussed earlier the solder mass 56, does not have an encapsulating layer and therefore the aspect ratio will further decrease and will form the solder mass 58, as shown in FIG. 10. It can now clearly be seen that the solder mass having an encapsulating layer forms an elongated interconnection compared to the interconnection that was used by the prior art, as shown in FIG. 7.

When using the decal process, a BLM layer 14, is not needed. A first solder mass would be deposited onto a carrier, e.g., a blank silicon wafer, and a substantially encapsulating barrier layer will be formed over the first solder mass. A second solder mass of either the same melting point or a lower melting point than the first solder- mass would be evaporated or deposited over the barrier layer, thereby forming the decal. At this point, unless additional solder mass layers are desired, the deposited solder masses are transferred from the decal onto the desired electronic components, such as a chip or a substrate. The carrier is removed or separated from the first solder mass after transfer of the solder masses by reflowing to the electronic component. Normally the electronic components have a higher melting point solder mass deposited prior to the transfer of the solder masses from the decal. Upon reflow, the high melting point solder from the electronic components and the low melting point solder for the decal forms a new solder mass having an intermediate melting point, which is now higher than the melting point of the second solder mass on the other side of the barrier layer. The prime purpose of the barrier layer is to prevent the migration of the intermediate melting point solder towards the low melting solder. This insures reworkability, i.e., the electronic components can later be separated, as the lower melting solder mass would melt prior to the intermediate melting point solder mass. Alternatively, this structure can be formed directly during substrate fabrication. That is, the low-melting solder mass can be deposited on the substrate, followed by the barrier layer and then the second solder mass, which is also low-melting. These depositions may be achieved by evaporation, plating, or any other suitable methods.

Figure 11:
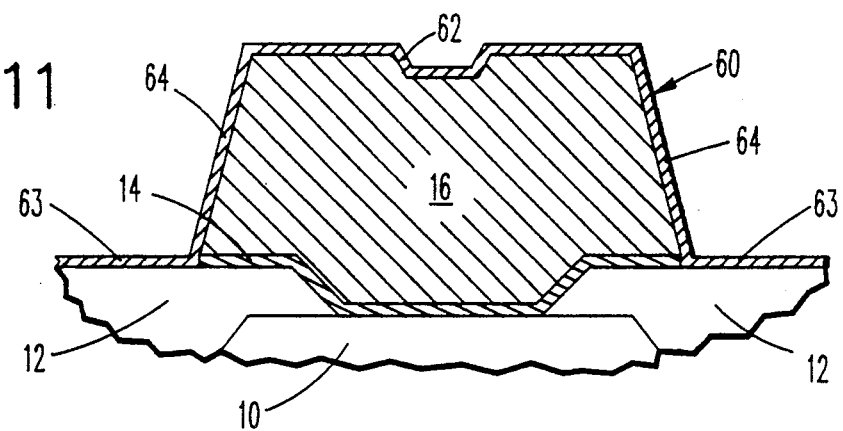
FIG. 11 is a side view of another embodiment of an elongated solder mass made according to the present invention, showing a first solder mass after conformal deposition of an encapsulating structure.
Figure 12:
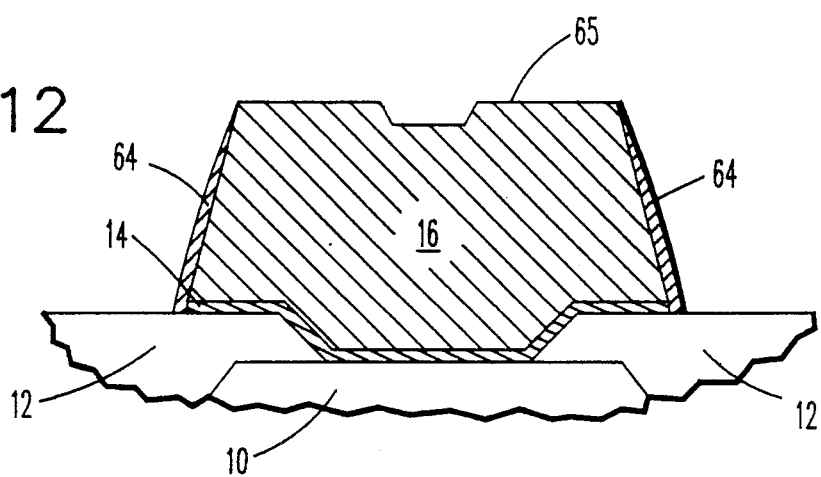
FIG. 12 is a side view of the elongated solder mass of FIG. 11, after directional etch-back of the conformal structure to form sidewall spacers.
Figure 13:
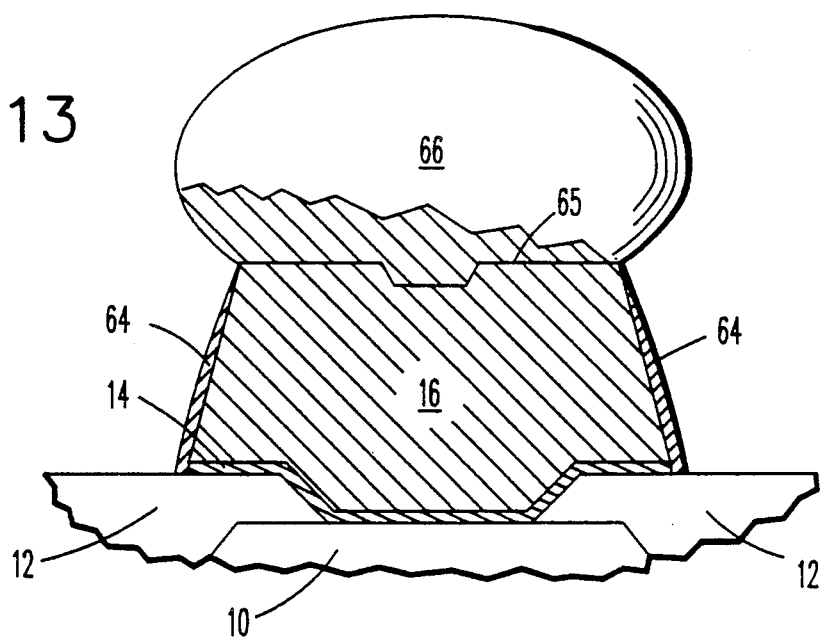
FIG. 13 is a side view of the elongated solder mass of FIG. 12, after formation of a second solder mass on the first solder mass, and reflow.

With reference to FIGS. 11, 12, and 13, another embodiment of the invention will now be described. This embodiment relates to the general use of encapsulating material which is put only on the side of the solder mass and also called a sidewall spacer. This sidewall spacer imparts rigidity to the solder mass. Such spacers may be formed using conformal deposition of (a) a single layer or multiple layers of Cu, Co, Mo, W, Ti, or similar metals; conductive nitrides or silicides of such metals; and/or combinations thereof; (b) a single layer or multiple layers of insulators such as silicon oxide, silicon nitride, silicon oxy-nitride or any suitable polymeric material; or (c) a multi-layered structure featuring both metals and insulators. Other materials in addition to those described above could be used, so long as they have the following properties:

a) the sidewall spacer material chosen must have a melting point sufficiently greater than the solder mass such that the material does not substantially deform during reflow; and b) the material must provide a sufficiently high degree of adhesion to the substrate such that it does not delaminate or deform during reflow or subsequent heating.

After deposition, the conformal sidewall material is directionally etched to remove it from horizontal surfaces without removing it from vertical surfaces. In practice, this can be achieved using a reactive ion etch process that has a sufficiently high etch rate ratio between the conformal material and the substrate. An example of such a RIE process would be a gas mixture (e.g. $CF_4+O_2$) that provides halogen-based radicals which complex with the materials mentioned above without substantially etching the solder mass support material.

After the sidewall spacers are formed, one or more solder masses may be then formed on the first solder mass in order to further elongate the solder column. Also, the additional solder mass may be supported by sidewall spacers. The additional solder masses may be of the same composition as the first solder mass or may have a composition with a lower melting point.

The main advantage associated with forming elongated solder bumps in this manner is that the choice of encapsulating materials is extended to insulators and is no longer restricted to materials that interact with solder (and may therefore dissolve into it). This method has the capability of increasing the bump structure stiffness when thick sidewall spacers are used. Also, even molten solder will be confined by the sidewall spacer "dam," therefore, second solder composition and processing are not restricted.

FIG. 11, is a side view of a first solder column 16, deposited on a BLM 14, on a substrate 12, (as in FIG. 5) after conformal deposition of an encapsulating structure 60. The structure 60, has a vertical wall or sidewall spacer 64, and horizontal layer 62. Conformal deposition may be accomplished by conventional chemical vapor depositon (CVD), conventional physical vapor depositions (PVD) such as sputtering, or other suitable means.

FIG. 12, is a side view of the structure of FIG. 11, after directional etch-back of the conformal structure 60, to form sidewall spacers 64. The directional etch-back may be accomplished by Reactive Ion Etching (RIE) or by sputter etching with inert gases such as Argon. The etch gas chemistry would be adjusted for the spacer material(s). Using any of the above-mentioned processes, the horizontal layer 62, and excess layer 63, that may have formed on the substrate 12, can be easily removed or etched, thereby leaving the upper surface 65, of the solder mass 16, for further processing.

FIG. 13, is a side view of the structure of FIG. 12, after formation of a second solder mass 66, and reflow of the solder mass 66. Additional solder masses associated with this embodiment would have the properties previously described for second solder masses in the other embodiments. Before forming the second solder mass 66, an electrically conductive material (not shown) comprising of a single layer or a multi-layer stack could be formed on the top surface of the first solder mass 16, as shown and discussed elsewhere in the specification.

The electrically conductive material 18 or 88 or 28 or 64 that is used to encapsulate the solder mass can be a solder wettable material selected from the group comprising Co, Cu, Ni, Pd, Pt, Ru or alloys thereof, or a non-solder wettable material selected from a group comprising Be, Cr, Fe, Hf, Mo, Nb, Ta, Ti, V, W, Zr and alloys thereof.

In some cases the electrically conductive encapsulating material 18 or 88, may comprise of a multi-layer stack X/Y/X, X/Y/Z, X/Y or X/Z, wherein the layer X or Z is a material selected from the group comprising Co, Cu, Ni, Pd, Pt, Ru and alloys thereof, and wherein the layer Y is either a solder wettable material selected from the group comprising Co, Cu, Ni, Pd, Pt, Ru and alloys thereof, or a non-solder wettable material selected from the group comprising Be, Cr, Fe, Hf, Mo, Nb, Ta, Ti, V, W, Zr and alloys thereof.

Figure 14:
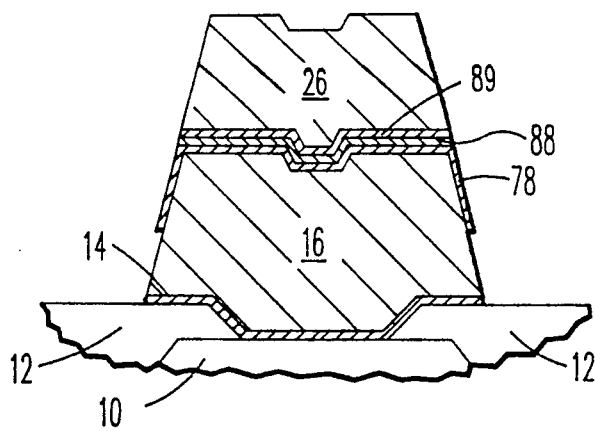
FIG. 14 is a side view of another embodiment of an elongated solder mass made according to the present invention, showing a multi-layered stack of electrically conductive material between two solder masses.

FIG. 14, shows another embodiment of the invention. On the already formed solder mass 16, a single layer 78, of solder wettable material is formed to substantially encapsulate the solder mass 16. A layer 88, of non-solder wettable material is formed over the top surface of the layer 78. The layer 88, could also substantially encapsulate the solder mass 16, and the already formed layer 78. A third layer 89, of solder wettable layer is then formed over the layer 88, to either cover the top surface of the layer 88, or to substantially encapsulate layer 88, or layer 78, or the solder mass 16. The second solder mass 26, is then formed over the layer 89, as described elsewhere in this specification.

The electrically conductive layer 78, 88 or 89, comprises a multi-layered structure XY, XZ, X/Y/X, or X/Y/Z, wherein the layer X (layer 78) or layer Z (layer 89) is a material selected from the group comprising Co, Cu, Ni, Pd, Pt, Ru and alloys thereof, and wherein the layer Y (layer 88) is either a solder wettable material selected from the group comprising Co, Cu, Ni, Pd, Pt, Ru and alloys thereof, or a non-solder wettable material selected from the group comprising Be, Cr, Fe, Hf, Mo, Nb, Ta, Ti, V, W, Zr and alloys thereof.

Figure 15:
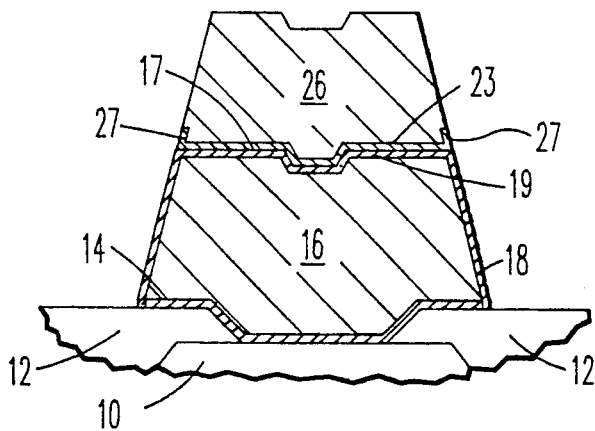
FIG. 15 is a side view of still another embodiment of an elongated solder mass made according to the present invention, showing a dam between two solder masses.

FIG. 15, shows still another embodiment of the solder interconnection. The structure is similar to the one shown in FIG. 3. The peripheral ring or dam 17, has a lip area 27, and a base area, 23. The base 23, could be formed with a solder wettable or non-solder wettable material. If the base 23, is formed of a non-solder wettable material then an additional layer (not shown) of solder wettable would be needed to securely bond and hold the second solder mass 26. The lip 27, preferably, should be of a non-solder wettable material. The lip 27, could be formed by various methods such as using a photoresist and selective etching followed by deposition, or by selective deposition at the outer periphery of the top surface of the already formed layer 18.

If solder wettable material is used for the base 23, then it would be selected from the group comprising Co, Cu, Ni, Pd, Pt, Ru or alloys thereof, or if a non-solder wettable material is used for the base 23 or the lip 27, then it would be selected from a group comprising Be, Cr, Fe, Hf, Mo, Nb, Ta, Ti, V, W, Zr and alloys thereof.

Figure 16:
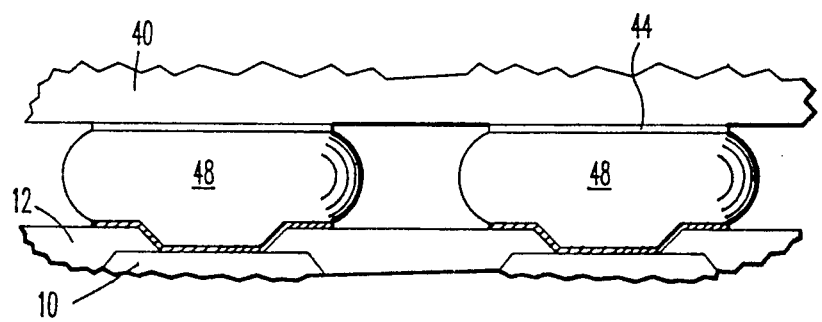
FIG. 16 (Prior Art) is a side view of two conventional, non-elongated interconnections showing the solder mass of FIG. 6, after joining to a substrate, with very little space between them.
Figure 17:
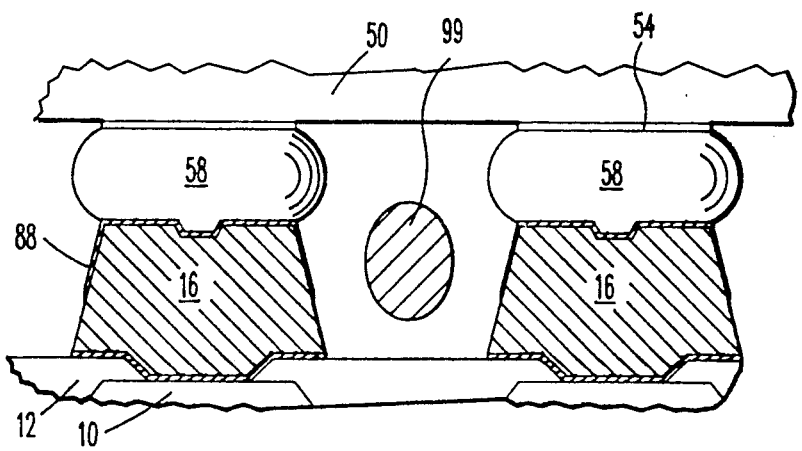
FIG. 17 is a side view of two elongated interconnections showing the solder mass of FIG. 9, after joining to a substrate showing that there is enough space between them to locate a signal carrier.

Additional advantage of the elongated solder masses that are formed using the methods of this invention is that more surface area on the electronic component becomes available as shown in FIG. 17, for additional items such as engineering change wires or other communication items such as fiber optic cables. These items are typically of 15 to 50 micron range and the standard interconnection structures leave insufficient space for clearance. FIGS. 16, and 17, further illustrate this phenomenon.

FIG. 16, shows two conventional, non-elongated solder interconnections, that are made as discussed in FIG. 6, and joined to a substrate 40. It can be clearly seen that there is very little space between the two conventional solder masses for forming or placing a signal carrier.

As shown in FIG. 17, the two elongated interconnections made according to the teachings of this invention and as discussed in conjunction with FIGS. 9 and 10, have enough space between two or more solder masses for locating a signal carrier 99, between them. This signal carrier 99, can be an electrical wire or an optical fiber or a solder link or a conductive paste. One should keep in mind that as discussed earlier a sidewall spacer would provide an insulative barrier for the solder mass that it encapsulates, allowing for the placement or formation of conductive wires between the solder masses.

EXAMPLES

The following examples are intended to further illustrate the invention and are not intended to limit the scope of the invention in any manner.

EXAMPLE 1

On a substrate a solder mass was formed by the conventional method. The solder mass was then substantially encapsulated with a rigid copper layer. Another solder mass was formed over the already encapsulated solder mass. The total height of the elongated patterned solder mass was found to be 8 mils high. After reflow, the top portion of the solder turned into a spherical shape. The total height of the elongated C4 was then found to be 6 mils tall. After chip join, the C4 joints were still measured to be 6 mils. After reflow and/or chip join, the solder prepared by this technique was 6 mil high in comparison to the 2.6 mil solder height obtained for the solder bump made by the conventional method which does not have a electrically conductive encapsulating material.

EXAMPLE 2

A rigid metal mask #1, with a opening or via diameter of d1, was aligned on the chip substrate and the initial solder mass or bumps were formed. Next, a rigid metal capping or encapsulating structure was formed over the initial solder mass. A rigid metal mask, mask #2, having an opening or via diameter of d2, where d2 is less than d1, was then aligned over the initial rigid metal capping layered structure and another layer of solder mass or bumps was deposited. This was followed by a rigid metal deposition on the second solder bump, thereby capping the second solder bumps. Next, a similar solder evaporation was utilized to form a third solder bump to maximize the column aspect ratio. The aspect ratio that resulted from the formation of the three solder masses or bumps along with the two capping layers was 3. Copper (Cu) was used to form the rigid metal capping or encapsulating structure. The solder material used was an alloy of 97 weight percent lead and 3 weight percent tin. The same solder material or alloy was used for all three solder bumps, and therefore the melting point for all three solder bumps was the same.

EXAMPLE 3

A rigid metal mask with an opening or via diameter equal to desired final solder bump diameter was aligned over a suitable via opening to an underlying conductor. An initial mass of solder was deposited by evaporation in the conventional manner through the metal mask. A metal capping or encapsulating structure consisting of copper was then deposited by evaporation through the same mask. Finally, a second solder mass was evaporated through the mask over the rigid copper layer (Sample I). Both solder masses consisted of an alloy of 97 weight percent lead and 3 weight percent tin.

For the purpose of comparison, an identical substrate and mask was prepared as described above, except that the rigid copper layer was absent (Sample II).

A third identical substrate and mask was used to prepare solder bumps in the conventional manner. (Sample III); i.e., no attempt was made to increase the solder height beyond that amount required to form solder bumps having aspect ratios (height/diameter) of about 0.8 (as-deposited) and about 0.7 (post-reflow).

All three samples were reflowed in a furnace having a reducing atmosphere (hydrogen) and under an identical set of conditions.

Physical measurements of the solder bumps prepared as described for each of the three sample populations described above post solder reflow are summarized in Table I. Note that the measurement for the "Joined-Column Height" is also included, for comparison. This parameter represents the "chip-height", which was obtained after "flip-chip" bonding to a substrate, is the value most commonly referenced in most mathematical models for solder-bump fatigue wear-out.

TABLE I*

| | Bump Diameter | Bump Height | Aspect Ratio | Joined-Column** Height |
|---|---|---|---|---|
| Sample I (w/Rigid Cu) | 6.6 | 6.8 | 1.0 | 6.3 (±1.1) |
| Sample II (w/o Rigid Cu) | 6.6 | 5.3 | 0.8 | 4.0 (±0.6) |
| Sample III (Conventional Control) | 6.6 | 4.6 | 0.7 | 3.5 (±0.5) |

*All Dimensions in mils
**Post Chip-Join to Substrate

EXAMPLE 4

The chip is processed through terminal metals BLM evaporation. A 2-3 mil layer of the high-melt solder (e.g., Pb, Sn, In, alloys, etc.) would then be evaporated on to this chip. This would be followed by the deposition of a suitable barrier material (e.g., Co, Ni, Cu, alloys, etc.) thin-film layer over the top of the high-melt solder. The thickness of the barrier layer is on the order of microns in thickness. Finally, a 0.5 to 1.5 mil layer of low-temperature solder (e.g., Pb, Sn, In, alloys, etc.) is evaporated to complete the structure.

These layers may be deposited by any suitable technique, such as, evaporation through a Mo mask, utilizing a lift-off technology, plating, etc.

EXAMPLE 5

Creating the desired structure during module fabrication has the advantage of not introducing fabrication changes to either the chip or substrate areas relative to current practice. This is made possible by introducing the structure through a new entity, a so-called decal which is reflowed to the substrate prior to chip attachment.

A decal is fabricated using scrap and bare silicon and no ball-limiting metallurgy. That is, the solder is deposited directly onto the silicon surface. The decal's metal structure is as follows. A thin layer (approximately 0.5 mil) of low-melt solder is evaporated first, followed by the barrier layer, and then another 0.5 to 1.0 mil layer of low-melt solder. This layer serves the same function as the low-melt layer described in the previous section (e.g., chip-fabrication approach); i.e., it provides attachment to the substrate upon reflow.

After the decal is reflowed to the substrate, the chip is attached to the decal structure. This chip-join step is also achieved at low temperatures owing to the decal's low-melt solder layer in contact with the chip. The low-melt solder layer thickness is purposely thin (approximately 0.5 mils) to assure a minimally perturbed layer adjacent to the high-melt solder. The interaction that does take place serves to raise the melting point of the reacted low-melt solder.

Accordingly, only the low-melt solder layer next to the substrate will melt if subsequently raised to the low-melt solder melting point. Again, it is this condition made possible by the barrier layer, which assures low-temperature device removal.

Again, the high-melt solder, comprising the majority of the joint, does not melt during any of the bonding, assembly, or the testing operations (e.g., initial join, reflow cycles, or chip removal).

EXAMPLE 6

The electronic component is masked using a rigid metal mask and processed through BLM and Pb/Sn solder evaporations. The rigid metal mask is removed and a conformal coating of plasma enhanced chemically vapor deposited (PECVD) silicon nitride is formed. During the deposition, the temperature of the substrate should be held below the melting point of the solder. A directional etch-back is performed using reactive ion etching techniques with a $CF_4 + O_2$ gas mixture. After a sidewall spacer has been formed, a second solder mass may be formed either by deposition through a mask or blanket deposition and reflow.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A solder interconnection comprising:
   a) a site for a solder mass,
   b) a first solder mass on said site,
   c) a material substantially encapsulating said solder mass, wherein said encapsulating material is an electrical conductor, said electrical conductor is either a solder wettable material selected from the group comprising Co, Cu, Ni, Pd, Pt, Ru, or alloys thereof, or a non-solder wettable material selected from a group comprising Be, Cr, Fe, Hf, Mo, Nb, Ta, Ti, V, W, Zr and alloys thereof.

2. The solder interconnection of claim 1, wherein said electronic component is either a chip or a substrate.

3. The solder interconnection of claim 1, wherein said encapsulating material is an electrical conductor, said electrical conductor is either a solder wettable material selected from the group comprising Co, Cu, Ni, Pd, Pt, Ru or alloys thereof, or a non-solder wettable material selected from a group comprising Be, Cr, Fe, Hf, Mo, Nb, Ta, Ti, V, W, Zr and alloys thereof.

4. A solder interconnection comprising:
   a) a site for a solder mass,
   b) a solder mass on said site, and
   c) a material substantially encapsulating said solder mass, wherein said encapsulating material is an electrical conductor comprising of a multi-layer stack X/Y/X, X/Y/Z, X/Y or X/Z, wherein said layer X or Z is a material selected from the group comprising Co, Cu, Ni, Pd, Pt, Ru and alloys thereof, and wherein said layer Y is either a solder wettable material selected from the group comprising Co, Cu, Ni, Pd, Pt, Ru and alloys thereof, or a non-solder wettable material selected from the group comprising Be, Cr, Fe, Hf, Mo, Nb, Ta, Ti, V, W, Zr and alloys thereof.

5. The solder interconnection of claim 1, wherein said site for said solder mass comprises a barrier material.

6. The solder interconnection of claim 1, wherein said solder interconnection has an aspect ratio of greater than 0.50.

7. A solder interconnection comprising:
   a) a site for a first solder mass,
   b) a first solder mass on said site,
   c) a first electrically conductive material substantially encapsulating said first solder mass, and
   d) at least a second solder mass on said first electrically conductive material.

8. The solder interconnection of claim 7, wherein the melting point of said first solder mass is different than the melting point of said second solder mass.

9. The solder interconnection of claim 7, wherein the melting point of said first solder mass is the same as the melting point of said second solder mass.

10. The solder interconnection of claim 7, wherein said site for said solder mass is on an active or a passive electronic component.

11. The solder interconnection of claim 10, wherein said electronic component is either a chip or a substrate.

12. A solder interconnection comprising:
   a) a site for a first solder mass,
   b) a first solder mass on said site,
   c) a first electrically conductive material substantially encapsulating said first solder mass, and
   d) at least a second solder mass on said first electrically conductive material;
   wherein said electrically conductive material is a solder wettable material selected from the group comprising Co, Cu, Ni, Pd, Pt, Ru or alloys thereof, or a non-solder wettable material selected from a group comprising Be, Cr, Fe, Hf, Mo, Nb, Ta, Ti, V, W, Zr and alloys thereof.

13. A solder interconnection comprising:
   a) a site for a first solder mass,
   b) a first solder mass on said site,
   c) a first electrically conductive material substantially encapsulating said first solder mass, and
   d) at least a second solder mass on said first electrically conductive material;
   wherein said electrically conductive material comprises a multilayer stack X/Y/X, X/Y/Z, X/Y or X/Z, wherein said layer X or Z is a material selected from the group comprising Co, Cu, Ni, Pd, Pt, Ru and alloys thereof, and wherein said layer Y is either a solder wettable material selected from the group comprising Co, Cu, Ni, Pd, Pt, Ru and alloys thereof, or a non-solder wettable material selected from the group comprising Be, Cr, Fe, Hf, Mo, Nb, Ta, Ti, V, W, Zr and alloys thereof.

14. The solder interconnection of claim 7, wherein said site for said first solder mass comprises a barrier material.

15. The solder interconnection of claim 7, wherein the site for said second solder mass comprises a barrier material.

16. The solder interconnection of claim 7, wherein the base cross-sectional area for said first solder mass is the same as the base cross-sectional area for said second solder mass.

17. The solder interconnection of claim 7, wherein the base cross-sectional area for said first solder mass is different than the base cross-sectional area for said second solder mass.

18. The solder interconnection of claim 7, wherein said solder interconnection has an aspect ratio of greater than 0.50.

19. A solder interconnection comprising:
a) a site for a first solder mass,
b) a first solder mass on said site,
c) a first electrically conductive material substantially encapsulating said first solder mass, and
d) at least a second solder mass on said first electrically conductive material;
wherein a second electrically conductive material substantially encapsulates said second solder mass, and at least a third solder mass is formed on said second electrically conductive material.

20. The solder interconnection of claim 19 wherein the melting point of said third solder mass is different than the melting point of said second solder mass.

21. The solder interconnection of claim 19, wherein the melting point of said second solder mass is the same as the melting point of said third solder mass.

22. The solder interconnection of claim 19, wherein said electrically conductive material is a solder wettable material selected from the group comprising Co, Cu, Ni, Pd, Pt, Ru or alloys thereof, or a non-solder wettable material selected from a group comprising Be, Cr, Fe, Hf, Mo, Nb, Ta, Ti, V, W, Zr and alloys thereof.

23. The solder interconnection of claim 19, wherein said electrically conductive material comprises of a multi-layer stack X/Y/X, X/Y/Z, X/Y or X/Z, wherein said layer X or Z is a material selected from the group comprising Co, Cu, Ni, Pd, Pt, Ru and alloys thereof, and wherein said layer Y is either a solder wettable material selected from the group comprising Co, Cu, Ni, Pd, Pt, Ru and alloys thereof, or a non-solder wettable material selected from the group comprising Be, Cr, Fe, Hf, Mo, Nb, Ta, Ti, V, W, Zr and alloys thereof.

24. The solder interconnection of claim 1, wherein said solder interconnection is on a decal.

25. The solder interconnection of claim 24, wherein said solder interconnection is transfered from said decal onto an active or a passive electronic component.

26. The solder interconnection of claim 25, wherein said electronic component is either a chip or a substrate.

27. The solder interconnection of claim 7, wherein said solder interconnection is on a decal.

28. The solder interconnection of claim 27, wherein said solder interconnection is transfered from said decal onto an active or a passive electronic component.

29. The solder interconnection of claim 2, wherein said electronic component is either a chip or a substrate.

30. The solder interconnection of claim 27, wherein the melting point of said first solder mass is different than the melting point of said second solder mass.

31. The solder interconnection of claim 27, wherein the melting point of said first solder mass is the same as the melting point of said second solder mass.

32. The solder interconnection of claim 19, wherein said solder interconnection is on a decal.

33. The solder interconnection of claim 32, wherein said solder interconnection is transfered from said decal onto an active or a passive electronic component.

34. The solder interconnection of claim 33, wherein said electronic component is either a chip or a substrate.

35. The solder interconnection of claim 32, wherein the melting point of said third solder mass is different than the melting point of said second solder mass.

36. The solder interconnection of claim 32, wherein the melting point of said second solder mass is the same as the melting point of said third solder mass.

37. The solder interconnection of claim 1, wherein a portion of said encapsulating material is a sidewall spacer comprising of an insulative material.

38. The solder interconnection of claim 37, wherein said sidewall spacer is comprised of a material selected from the group comprising silicon oxide, silicon nitride, silicon oxy-nitride or a polymeric material.

39. The solder interconnection of claim 37, wherein said sidewall spacer is made of a material that does not deform during subsequent heating of said solder mass.

40. The solder interconnection of claim 37, wherein the upper surface of said first solder mass has a second solder mass.

41. The solder interconnection of claim 40, wherein at least a portion of said second solder mass is surrounded by a sidewall spacer.

42. The solder interconnection of claim 41, wherein at least one of said sidewall spacer is formed of at least layer of conductive material and at least one layer of insulative material.

43. The solder interconnection of claim 40, wherein between said first solder mass and said second solder mass there is at least one electrically conductive layer.

44. The solder interconnection of claim 40, wherein the upper surface of said second solder mass has a third solder mass.

45. The solder interconnection of claim 7, having a peripheral ring over the upper surface of said electrically conductive material to prevent the running down of said second solder mass.

46. The solder interconnection of claim 1, wherein a signal carrier is located between at least two of said solder interconnections.

47. The solder interconnection of claim 46, wherein said signal carrier is an electrical wire or an optical fiber or a solder link or a conductive paste.

* * * * *

UNITED STATES PATENT AND TRADEMARK OFFICE
CERTIFICATE OF CORRECTION

PATENT NO.  : 5,130,779

DATED       : 07/14/92

INVENTOR(S) : BIRENDRA N. AGARWALA, ET AL.

It is certified that error appears in the above-identified patent and that said Letters Patent is hereby corrected as shown below:

Column 17, lines 58-59:

Claim 2.  Delete: "The solder interconnection of claim 1, wherein said electronic component is either a chip or a substrate.

Insert: --The solder interconnection of Claim 1, wherein said site for said solder mass is on an active or a passive electronic component.--

Column 17, lines 60-66:

Claim 3.  Delete: "The solder interconnection of claim 1, wherein said encapsulating material is an electrical conductor, said electrical conductor is either a solder wettable material selected from the group comprising Co, Cu, Ni, Pd, Pt, Ru or alloys thereof, or a non-solder wettable material selected from a group comprising Be, Cr, Fe, Hf, Mo, Nb, Ta, Ti, V, W, Zr and alloys thereof.

UNITED STATES PATENT AND TRADEMARK OFFICE
CERTIFICATE OF CORRECTION

PATENT NO. : 5,130,779
DATED : 07/14/92
INVENTOR(S) : BIRENDRA N. AGARWALA, ET AL.

It is certified that error appears in the above-indentified patent and that said Letters Patent is hereby corrected as shown below:

Insert: --The solder interconnection of Claim 2, wherein said electronic component is either a chip or a substrate.--.

Signed and Sealed this

Twentieth Day of September, 1994

Attest:

BRUCE LEHMAN

Attesting Officer

Commissioner of Patents and Trademarks